United States Patent [19]
Kozlowski et al.

[11] Patent Number: 5,929,434
[45] Date of Patent: Jul. 27, 1999

[54] ULTRA-LOW NOISE HIGH BANDWIDTH INTERFACE CIRCUIT FOR SINGLE-PHOTON READOUT OF PHOTODETECTORS

[75] Inventors: Lester J. Kozlowski, Simi Valley; William A. Kleinhans, Westlake, both of Calif.

[73] Assignee: Rockwell Science Center, LLC, Thousand Oaks, Calif.

[21] Appl. No.: 08/910,342

[22] Filed: Aug. 13, 1997

[51] Int. Cl.[6] .............................. H01L 27/14; H03F 3/16
[52] U.S. Cl. .................... 250/214 A; 250/214 LA
[58] Field of Search .................. 250/214 A, 214 LA, 250/208.1; 330/59; 257/290

[56] References Cited

U.S. PATENT DOCUMENTS

| | | | |
|---|---|---|---|
| 3,770,968 | 11/1973 | Hession et al. | 250/214 R |
| 3,927,383 | 12/1975 | Fjarlie et al. | 330/59 |
| 4,473,836 | 9/1984 | Chamberlain | 357/30 |
| 4,555,623 | 11/1985 | Bridgewater et al. | 250/214 A |
| 4,567,363 | 1/1986 | Goodnough | 250/214 A |
| 4,855,687 | 8/1989 | Hebert | 330/304 |
| 5,399,989 | 3/1995 | Chern | 330/254 |
| 5,473,467 | 12/1995 | Miller | 359/333 |
| 5,572,074 | 11/1996 | Standley | 307/117 |
| 5,589,881 | 12/1996 | Dunham et al. | 348/300 |

OTHER PUBLICATIONS

Chamberlain and Lee, "A Novel Wide Dynamic Range Silicon Photodector and Linear Imaging Array", *IEEE Transactions on Electronic Devices,* vol. ED–31, No. 2, Feb. 1984, pp. 175–182.

Kozlowski et al., "Infrared Detectors and Focal Plane Arrays IV", *SPIE–The International Society for Optical Engineering,* vol. 2746, 1996, pp. 93–100.

*Primary Examiner*—Edward P. Westin
*Assistant Examiner*—Thanh X. Luu
*Attorney, Agent, or Firm*—Koppel & Jacobs

[57] ABSTRACT

An ultra-low noise, high gain interface circuit for single-photon readout of known photodetectors from the x-ray to long IR bands at video frame rates. The detector current modulate's a load FET's gate-to-source voltage, which in turn modulates the gate-to-source voltage of a gain FET thereby producing a signal current that is an amplified facsimile of the detector current. The load FET's gate-to-source voltage is connected in the negative feedback loop of a low noise, high gain amplifier. This effectively reduces the resistance seen by the photodetector by the gain of the amplifier thereby reducing the interface circuit's RC time constant by the same amount. Because the amplifier pins the load FET's gate voltage for a given flux level, the load FET's 1/f noise is transferred to the amplifier thereby enabling single-photon readout sensitivity.

16 Claims, 3 Drawing Sheets

ULTRA-LOW NOISE HIGH BANDWIDTH INTERFACE CIRCUIT FOR SINGLE-PHOTON READOUT OF PHOTODETECTORS

BACKGROUND OF THE INVENTION

1. Field of the Invention

This invention relates to ultra-low noise photon detection in low light conditions and more specifically to an ultra-low noise, high gain interface circuit for single-photon readout of off-the-shelf photodetectors at video frame rates.

2. Description of the Related Art

Optical sensors transform incident radiant signals in the X-ray ($\lambda=0.2\,\mu m$) visible ($\lambda=0.4$–$0.8\,\mu m$), near infrared (IR) ($\lambda=0.8$–$2\,\mu m$), shortwave IR ($\lambda=2.0$–$2.5\,\mu m$), mid IR ($\lambda=2.5$–$5\,\mu m$), and long IR ($\lambda=5$–$20\,\mu m$) bands into electrical signals that are used for data collection, processing, and storage such as in real-time digital video signals. Available photodetectors such as photodiodes and photoconductors are inexpensive, exhibit bandwidths that support current video frame rates, are sensitive to wavelengths well into the long IR band, and exhibit a high degree of pixel-to-pixel uniformity when used in an imaging array. However, these photodetectors have no gain, i.e. each incident photon generates a single electron, and thus photodetector imaging systems work very well in moderate to bright light conditions, but generate electrical signals at low light levels that are too small to be read-out by conventional readout circuits.

In low light conditions, the standard photodetector is replaced with an avalanche photodiode that exhibits enough gain so that conventional readout circuits can readout the data at video frame rates with a high signal-to-noise ratio (SNR). The fabrication of avalanche photodiodes is much more difficult and expensive than standard photodetectors because they must exhibit very high controlled gain and very low noise. Furthermore, currently available avalanche photodiodes exhibit relatively poor uniformity, are constrained to much lower wavelengths than standard photodetectors (1.5 $\mu m$), and have limited sensitivity due to their relatively low quantum efficiency. Imaging intensified systems use an array of avalanche photodiodes to drive respective display elements such as CCDs or phosphors, and have even lower wavelength capabilities (approximately 0.6 $\mu m$ max) due to the limitations of the photodiode.

Chamberlain et al. "A Novel Wide Dynamic Range Silicon Photodetector and Linear Imaging Array" IEEE Transactions on Electron Devices, Vol. ED-31, No. 2, February 1984, pp. 175–182 describes a gate modulation technique for single-photon readout of standard photodetectors. Chamberlain provides a high gain current mirror that includes a load FET whose gate is connected to its drain to ensure subthreshold operation and to eliminate threshold voltage $V_T$ non-uniformity. The pixel-to-pixel $V_T$ non-uniformity associated with standard silicon CMOS fabrication processes would otherwise substantially degrade the performance of the imaging array. The signal from the photodetector is injected into the load FET thereby producing a signal voltage at the gate of a gain FET. This signal modulates the gain FET's gate voltage, thereby storing integrated charge in a storage capacitor that is readout and reset via a pair of FET switches.

Although Chamberlain's particular gain modulation technique provides a large dynamic range and is capable of detecting wavelengths into the long IR range, the bandwidth of the current mirror severely restricts the bandwidth of the overall detector. Specifically, the RC time constant seen by the photodetector is the parallel combination of the photodetector's capacitance and the resistance of the load FET. In subthreshold operation, the FET's transconductance is very low and, hence, its load resistance is very large, on the order of $10^{14}$ ohms. As a result, the RC time constant is on the order of seconds. Thus, Chamberlain's gate modulation technique is only practically useful for imaging static scenes such as stars. Furthermore, to achieve large current gain, the load FET is typically quite small. As a result, the load FET exhibits substantial 1/f noise, which under low light conditions seriously degrades the performance of the imaging array.

Kozlowski et al. "SWIR staring FPA Performance at Room Temperature," SPIE Vol. 2746, pp. 93–100, April 1996 describes a phenomenon called "night glow" in the short wavelength infrared (SWIR) band that enables detection on very dark nights where photon flux is on the order of one hundred photons per imaging frame. Kozlowski details InGaAs and HgCdTe detector arrays for use with two different readout circuits. Both use Chamberlain's gate modulation technique but one also buffers the detector node to maintain constant detector bias. Unlike SWIR band and longer wavelength detector arrays, near IR and visible detectors are not sensitive to changes in detector bias, and thus buffering to maintain constant bias is irrelevant.

SUMMARY OF THE INVENTION

In view of the above problems, the present invention provides an ultra-low noise, high gain interface circuit for single-photon readout of known photodetectors from the x-ray to long IR bands at video frame rates.

This is accomplished with the known current mirror configuration by connecting the load FET's gate-to-source voltage in the negative feedback loop of a low noise, high gain amplifier. As the incident flux falls towards zero photons per frame, the feedback loop slows down to the RC time constant set by the current mirror thereby avoiding destabilization. As the flux increases, the amplifier recovers and speeds up the feedback loop. This effectively reduces the resistance seen by the photodetector by the gain of the amplifier thereby reducing the interface circuit's RC time constant by the same amount. Because the amplifier pins the load FET's gate voltage for a given flux level, the load FET's 1/f noise is transferred to the amplifier thereby enabling single-photon readout sensitivity. In a preferred embodiment, switched capacitors are used to linearize the circuit. The interface circuit is preferably fabricated using high quality epi or neutron transmutation doped wafers with a thin oxide to provide adequate threshold voltage $V_T$ uniformity.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a high bandwidth, ultra low-noise interface circuit that is capable of single-photon readout of photodetectors in extremely low light conditions, i.e. photon flux levels approaching zero photons per sampling period. This circuit can be used to count incident photons on individual photodetectors or in an imaging array as the front-end to a conventional video system. One of the primary benefits of the current approach is that the circuit can use off-the-shelf photodetectors such as photodiodes or photoconductors that have zero gain rather than avalanche photodiodes. Known photodetectors are cheaper, more uniform, easier to fabricate, more reliable, less susceptible to noise and are available at much longer wavelengths than current avalanche photodiodes.

Figure 1:
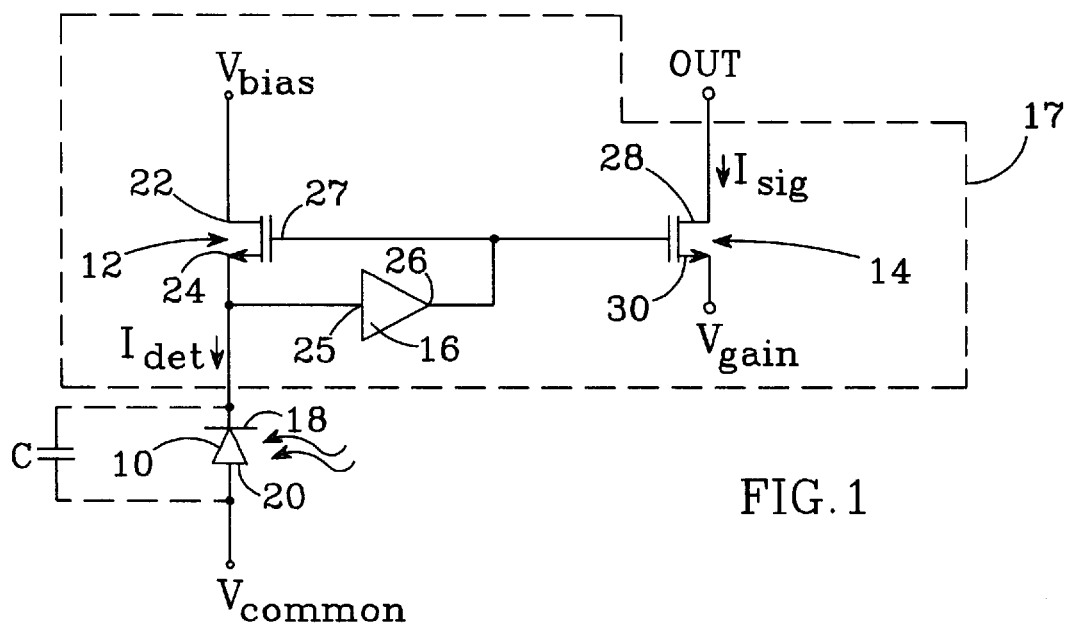
FIG. 1 is a schematic diagram of an ultra-low noise, high gain interface circuit for single-photon readout of known photodetectors in accordance with the present invention.

As shown in FIG. 1, a photodetector 10 injects a small-signal detector current $I_{det}$ into a load FET 12 causing its gate-to-source voltage to self-adjust. This in turn modulates the gate-to-source voltage of a gain FET 14 so that it conducts a signal current $I_{sig}$ that is an amplified facsimile of the photocurrent. The FETs, which form a current mirror, are biased to provide a very large current gain. Current gains on the order of twelve million have been measured under laboratory conditions. A low noise, high gain amplifier 16 is connected in a negative feedback loop around the load FET's gate-to-source voltage to expand the circuit's bandwidth and reduce its noise figure. Thus, the interface circuit 17 defined by the current mirror and amplifier facilitates continuous or sampled readout of the signal current at very high bandwidths while maintaining a high SNR.

The gain of amplifier 16, on the order of a million, speeds up the self-adjustment of the load FET's gate-to-source voltage, effectively dividing the RC time constant seen by photodetector 10 by the gain. When the photon flux approaches zero, the amplifier's negative feedback loop appears to slow down towards the bandwidth set by the RC time constant thereby maintaining a stable gate voltage. It was unknown whether stability could be achieved at such low flux levels. Conventional wisdom would dictate that the amplifier would rail to either its supply voltage or ground thereby destroying the signal until the flux levels increased. As the flux increases, the amplifier recovers and speeds up to re-expand the circuit's bandwidth. The amplifier also pins the load FET's gate voltage for a given detector current so that its 1/f noise is transferred to the amplifier thereby lowering the circuit's noise figure such that single-photon sensitivity can be achieved.

The particular circuit topology shown in FIG. 1 is an all N-channel, non-inverting interface circuit that exhibits a non-linear small signal current gain $A_I = g_{gain}/g_{load}$ where $g_{gain}$ and $g_{load}$ are the transconductances of the load and gain FETS, respectively. Specifically, photodetector 10 is a photodiode whose anode 20 is held at a common voltage $V_{common}$ such as ground or +5 V and whose cathode 18 injects photocurrent into the load FET's source 24. The FET's drain 22 is held at a bias voltage $V_{bias}$, which can be generated off-chip or on-chip using bandgap reference circuits, that reverse biases photodiode 10. The photodiode also exhibits a parasitic capacitance C that is connected in parallel with the photodiode. InGaAs, HgCdTe, or III–V compound photodiodes that exhibit no gain can be employed in this configuration. The specific design will depend upon the desired operating temperature and wavelength and must provide a dark current that is much less than the illuminated detector current.

Because the detector current $I_{det}$ is very small, load FET 12 operates in its subthreshold region, where the FET's channel is below the threshold for conduction, but some current flows anyway due to the small population of thermally energetic electrons. As a result, the current is an exponential function of the gate-to-source voltage $V_{gs}$ given by:

$$I_{det} = k_l exp\ (V_{gs} - V_T) \qquad (1)$$

where $V_T$ is the threshold voltage and $k_l$ is a constant that is determined by FET geometry, carrier mobility, etc.

The load FET's transconductance $g_{load}$, which is the differential change in drain current induced by the modulation of the FET's gate-to-source voltage, is proportional to its drain current, i.e. the detector current $I_{det}$. Thus, in the subthreshold region, the FET transconductance is very small, which is necessary to achieve high current gain. However, because the transconductance is small the output resistance R seen by the photodiode is large, on the order of $10^{14}$ ohms. Therefore, the photodiode's RC time constant, which is equal to the parallel combination of the parasitic capacitance C and the FET's output resistance R, is large, on the order of seconds.

Amplifier 16 is connected in a negative feedback configuration around load FET 12's gate-to-source. In particular, the amplifier's input 25 is connected to the FET's source 24 and its output 26 is connected to the FET's gate 27. Amplifier 16 may be a single-ended inverting amplifier of the type shown in FIG. 5 or a differential amplifier of the type shown in FIG. 6. Single-ended amplifiers require less chip space but differential amplifiers provide higher gain and have better common mode rejection ratio (CMRR). The amplifier, and specifically its negative feedback loop, speeds up the load FET's self-adjustment process by the gain of the amplifier. Typical amplifier gains are on the order of a million such that the effective time constant is on the order of microseconds, much less than the sampling intervals of contemporary digital video systems. The amplifier also stabilizes the voltage at gate 27 for a given flux such that it is insensitive to the load FET's 1/f noise.

Gain FET 14 preferably shares a common gate 27 with load FET 12 to reduce $V_T$ non-uniformity. The gain FET's drain 28 is connected to the output terminal OUT and source 30 is connected to a gain voltage $V_{gain}$, which can be generated off-chip or on-chip using bandgap reference circuits, that biases the gain FET to operate in saturation. The signal current $I_{sig}$ is a quadratic function of the gate-to-source voltage given by:

$$I_{sig} = k_g (V_{gs} - V_T)^2 \qquad (2)$$

where $k_g$ is a constant that is determined by FET geometry, carrier mobility, etc. The gain FET's transconductance $g_{gain} = 2(k_g I_{sig})^{1/2}$. Thus, in saturation the gain FET's transconductance and, hence the interface circuit's current gain $A_I$, can be made relatively large by controlling the value of $k_g$. Because the load and gain FETs operate in different regions, i.e. the subthreshold and saturation regions, respectively, the current gain $A_I$ is a function of the detector current $I_{det}$. Specifically, the gain curve exhibits a logarithmic response.

Although described as an all N-channel embodiment, the interface circuit can be implemented with some or all P-channel FETs. In an all P-channel circuit, the load FET's source is connected to the photodiode and its drain is connected to $V_{bias}$. In this topology, the amplifier establishes the reverse bias of the photodiode. The P-channel gain FET is connected the same as the N-channel gain FET. To implement an inverting circuit, one of the FETs is N-channel and the other is P-channel. As shown in detail in FIG. 3, the interface circuit can be linearized so that the gain is independent of detector current by connecting large resistors in series with the respective FETs that dominate the FETs' transimpedances so that the current gain $A_I$ is set by the ratio of these resistors.

Figure 2:
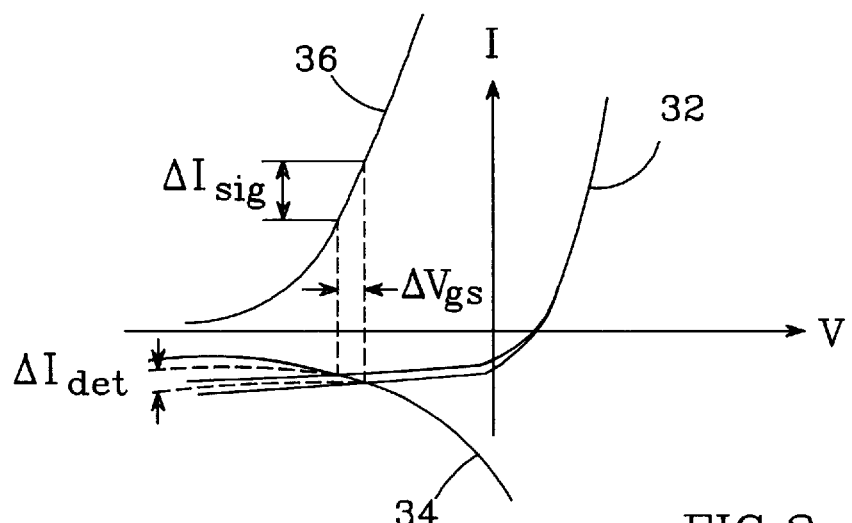
FIG. 2 is an I–V plot of the load lines for the interface circuit shown in FIG. 1.

FIG. 2 is an I–V plot (not to scale) illustrating the small-signal operation of the interface circuit shown in FIG. 1. As shown the interface circuit operates in the reverse bias region of the photodiode's response curve 32, i.e. V<0. Following convention, the load FET's exponential load line 34 and the gain FET's quadratic load line 36, are plotted on opposite sides of the voltage axis for purposes of clarity. The slope of the load line represents the FET's transconductance.

At a given flux, the photodiode's response curve 32 intersects the load FET's load line 34 thereby setting its gate-to-source voltage. The load FET's $V_{gs}$ maps to the gain FET's load line 36, which establishes the signal current $I_{sig}$. A change in the incident flux causes the photodiode's response curve 32 to shift by $\Delta I_{det}$. As a result, the load FET's operating point moves along its load line 34 to the new point of intersection, i.e. the load FET self-adjusts its gate-to-source voltage by $\Delta V_{gs}$ to conduct the photocurrent. The same $\Delta V_{gs}$ moves the operating point of the gain FET along its load line 36 producing a change in signal current $\Delta I_{sig}$.

To achieve large current gains, the load FET is biased so that a small change in photocurrent induces a large change in gate-to-source voltage and gain FET is biased to that a small change in its gate-to-source voltage induces a large change in signal current. In other words, the load FET's load line 34 is relatively flat and the gain FET's load line 36 is relatively steep in the reverse biased region; much flatter and much steeper than actually shown in the I–V plot. The logarithmic nature of the current gain as a function of photocurrent is evident from the exponential and quadratic shapes of load lines 34 and 36.

Figure 3:
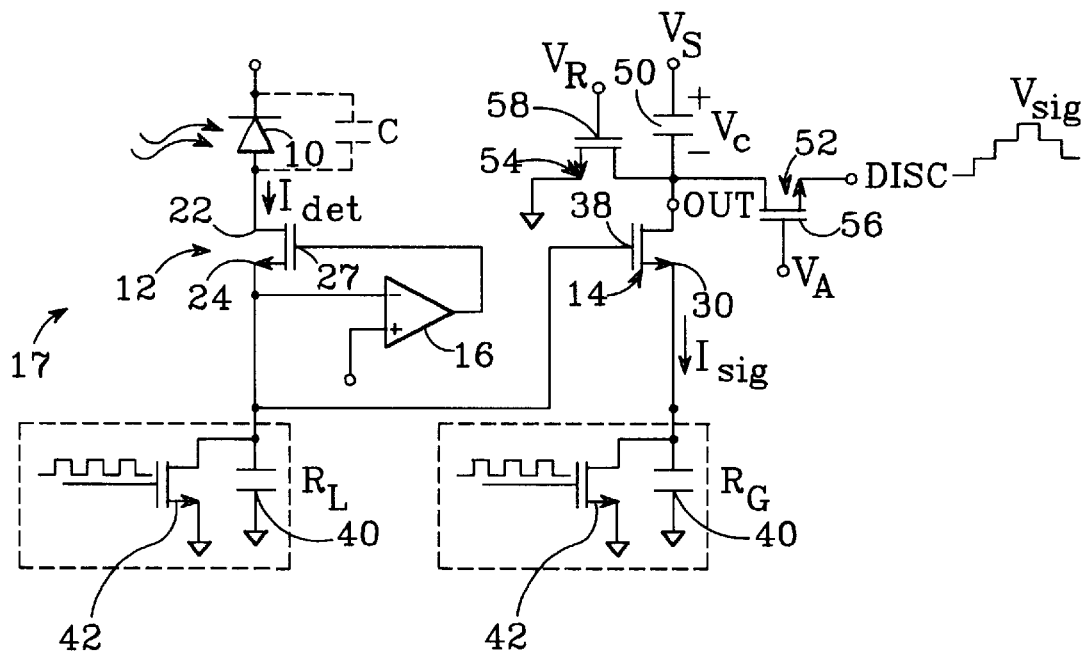
FIG. 3 is a schematic diagram of an ultra-low noise, high gain linearized interface circuit for single-photon readout of known photodetectors at video frame rates.

FIG. 3 is an alternate embodiment of the interface circuit in which the current gain is constant and the signal current $I_{sig}$ is sampled and readout at video frame rates. The interface circuit is "linearized" to remove the logarithmic dependence on photocurrent by connecting a pair of resistors $R_L$ and $R_G$ between the FETs' respective sources 24 and 30 and ground and connecting the gain FET's gate 38 at the top of the load resistor $R_L$. As a result, the voltage at the gate of the load FET is pinned and its source voltage across the load resistor $R_L$ is modulated by the photocurrent. The resistors are large enough to dominate the FETs' transimpedances so that the current gain $A_I = R_L / R_G$.

Figure 4:
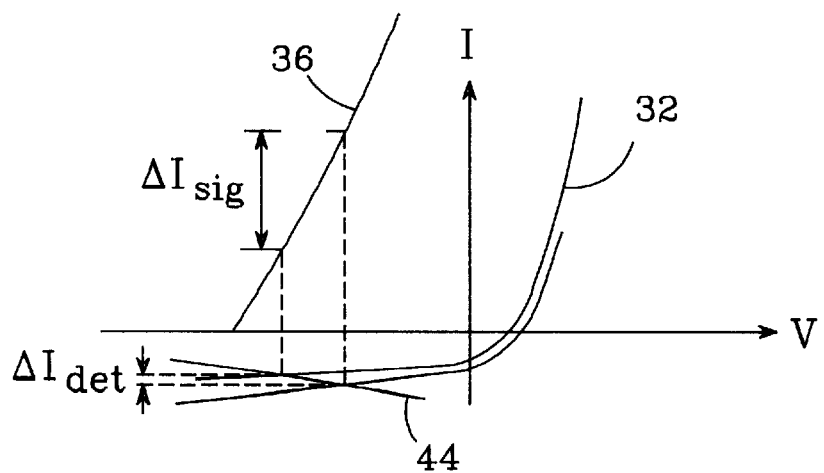
FIG. 4 is a plot of the load lines for the linearized interface circuit shown in FIG. 1.

In the preferred embodiment, both resistors are implemented as switched capacitors whose resistance can be varied to set the current gain. The simplest switched capacitor includes a capacitor 40 and a FET switch 42 that are connected in parallel between the load/gain FET's source and ground. The FET switch 42 is pulse width modulated (PWM) to alternately charge and discharge the capacitor 40. The pulse width is controlled to set the resistance $R_L$ or $R_G$ of the switched capacitor to establish a desired current gain. As shown in FIG. 4, the load lines 44 and 46 associated with the load and gain FETs, respectively, are now linear with constant slopes ($1/R_L$) and ($1/R_G$) so that the current gain is held constant regardless of changes in photocurrent.

In the embodiment shown in FIG. 3, the signal current $I_{sig}$ stores integrated charge in a storage capacitor 50 that is tied to supply voltage $V_S$ and readout and reset via a pair of FET switches 52 and 54. Access and reset FET switches 52 and 54 are connected between a terminal DISC and ground, respectively, and the common output terminal OUT. The gate 56 of access switch 52 is driven with a voltage $V_A$ that switches at a sampling frequency $f_s$ to sample the voltage $V_C$ developed across the storage capacitor and output a discrete voltage signal $V_{sig}$ at the DISC terminal. The gate 58 of reset switch 54 is driven with a voltage $V_R$ that switches at the same sampling frequency $f_s$ as the access switch but 180 degrees out of phase to discharge the storage capacitor 50. The sampling frequency $f_s$ exceeds the bandwidth defined by the RC time constant but is less than the circuit's expanded bandwidth so that the discrete voltage signal accurately tracks the small-signal detector current.

Figure 5:
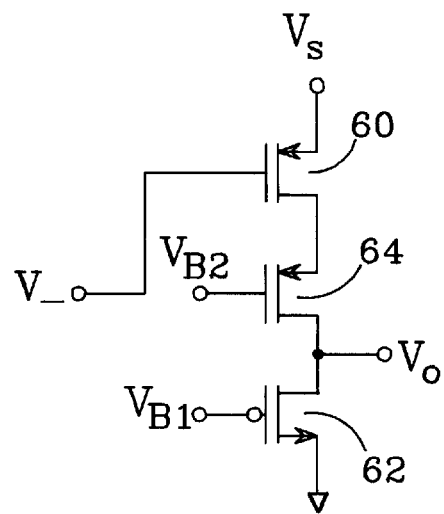
FIG. 5 is a schematic diagram of one embodiment of a single-ended amplifier for use in the interface circuit.

FIG. 5 illustrates one embodiment of a single-ended amplifier for use in the interface circuits shown in FIGS. 1 and 3. In the single-ended CMOS inverter amplifier, an input signal $V_-$ whose voltage is more negative than was previously present causes the p-MOSFET driver 60 to conduct more strongly. In response, the amplifier's output voltage subsequently swings to a more positive potential since the load FET's (an n-MOSFET device 62 whose nominal operating resistance is set by gate voltage $V_{B1}$) relative operating resistance will be proportionally larger than before. An input signal $V_-$ whose voltage is more positive causes the driver MOSFET 60 to conduct less strongly; the resulting output voltage $V_o$ thus swings again in a direction opposite to that of the input signal. The open-loop gain of this basic cascoded CMOS inverter amplifier (with a p-MOSFET cascode 64 having identical geometry to the p-FET driver and biased by gate voltage $V_{B2}$) is:

$$A_v = -\left( \frac{g_m * r_d}{1 + \frac{r_d}{R_L}} \right) \quad (3)$$

where $g_m$ is the transconductance of the p-MOSFET amplifier, $r_d$ is the drain-source resistance of the load MOSFET and $R_L$ is the load resistance at the amplifier output. Since this load is often purely capacitive for the intended application, the denominator is often unity. In the absence of a cascode MOSFET, the gain is limited to $-g_m \cdot r_d$.

Figure 6:
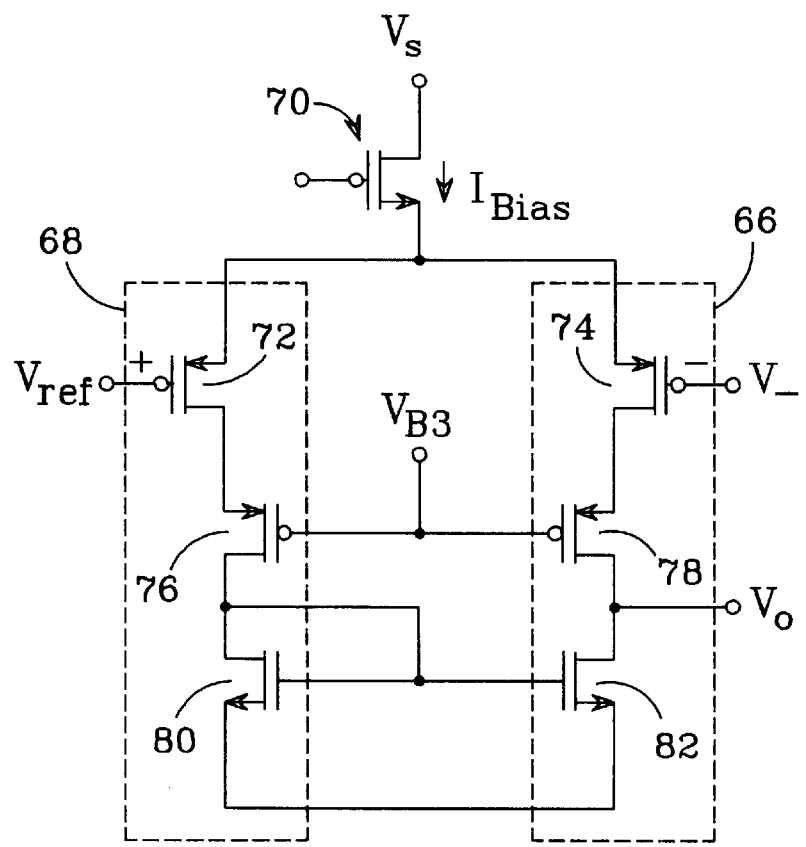
FIG. 6 is a schematic diagram of one embodiment of the differential amplifier used in the interface circuit.

FIG. 6 illustrates one embodiment of a differential amplifier for use in the interface circuits shown in FIGS. 1 and 3. In the differential CMOS amplifier, the input signal $V_-$ is applied to the inverting input leg 66 and a reference voltage $V_{ref}$ is applied to the non-inverting leg 68. Under quiescent operating conditions where there is no difference in the voltages at the inverting and noninverting inputs, the bias current $I_{bias}$ from the current source 70 is divided equally between both legs owing to the identical p-MOSFET drivers 72,74, p-MOS cascodes 76,78 having a common gate voltage $V_{B3}$ and the Wilson load comprising an n-MOSFET current mirror with identical n-type transistors 80,82.

Applying an input voltage which is relatively more negative than the quiescent case to the inverting terminal causes the p-MOSFET driver 74 to conduct more strongly. The amplifier hence becomes unbalanced and more bias current flows through the inverting leg 66 than through the noninverting leg 68. In direct response, the Wilson load (FETs 80 and 82) reacts by decreasing the gate-to-source voltage and hence increasing the $r_d$ of the n-MOSFET Wilson load. This causes the output voltage $V_o$ to swing in a positive direction which is opposite to that of the input signal. The open-loop gain of the cascoded CMOS differential amplifier is essentially identical to that of the cascoded CMOS inverter if identical MOSFET geometries are used.

Figure 7:
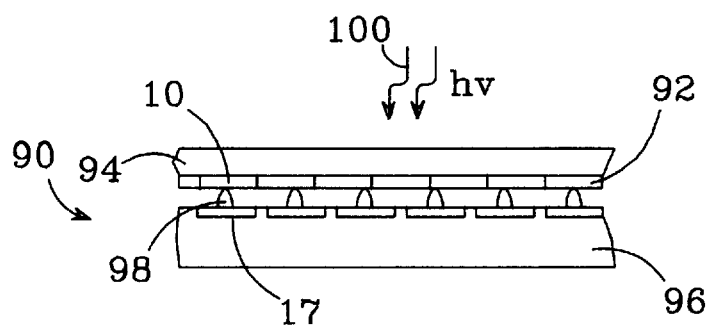
FIG. 7 is a simplified sectional view of a mixed-signal embodiment of the interface circuit shown in FIG. 1.

As shown in FIG. 7, an imaging array 90 is preferably fabricated with a hybrid structure. A photodetection layer 92 is grown using molecular beam epitaxy, for example, on a transparent detector substrate 94 to define an array of photodiodes 10. The interface circuit 17 for each photodiode is preferably fabricated in a silicon layer 96 using high quality epi or neutron transmutation doped wafers with a thin oxide to provide adequate threshold voltage $V_T$ uniformity. The photodetection layer 92 is flip-chip mounted on silicon layer 96 using an array of indium bumps 98 to connect the photodiodes 10 to respective interface circuits 17.

A continuous illumination pattern 100, with flux levels near zero, penetrates the detector substrate 94 where it is spatially sampled by the photodiode array. Each photodiode 10 generates a detector current that is proportional to the number of photons incident in that pixel area during each sampling interval. The detector currents $I_{det}$ are communicated through the indium bumps 98 to the respective interface circuits 17 where they are amplified and sampled. The discrete signals produced at each sampling instance together define one frame of a video signal, for example.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A single-photon readout circuit, comprising:
   a photodetector that generates a small-signal detector current in response to incident photons;
   a current mirror having a load field effect transistor (FET) biased to operate in its sub-threshold region and which exhibits 1/f noise and a gain FET having a transconductance $g_{gain}$, said small-signal detector current modulating the load FET's gate-to-source voltage, which in turn modulates the gain FET's gate-to-source voltage so that said gain FET conducts a signal current that is an amplified facsimile of said small-signal detector current, said photodetector having a capacitance and said load FET having a transconductance $g_{load}$ that together define an RC time constant that limits the circuit's bandwidth,
   an amplifier that is connected in a negative feedback loop around said load FET's gate-to-source voltage, said amplifier reducing the response time of said load FET to changes in detector current so that the RC time constant is divided by the gain of the amplifier thereby expanding the circuit's bandwidth, said amplifier also pinning the load FET's gate voltage for a given detector current so that the load FET's 1/f noise, which would otherwise induce some amount of jitter on the modulation of the gain FET, is transferred to the amplifier, and
   a sampling circuit that samples the signal current, said sampling circuit comprising:
      a capacitor that integrates the signal current to produce a signal voltage,
      an access switch that is clocked at a sampling frequency $f_s$ to read said signal voltage, and
      a reset switch that is clocked at said sampling frequency $f_s$ to discharge said capacitor after said signal voltage is read, said sampling frequency selected to be less than the readout circuit's expanded bandwidth defined by said current mirror's RC time constant scaled by the gain of said amplifier, thereby limiting the bandwidth of the current mirror defined by its RC time constant such that the sampled signal current accurately tracks the small-signal detector current.

2. The readout circuit of claim 1, wherein said gain FET has a transconductance $g_{gain}$, said load and gain FETs sharing a common gate such that the gain of said current mirror is set by the ratio of their transconductances.

3. The readout circuit of claim 2, wherein said load FET operates in its sub-threshold region where its gate-to-source voltage is a logarithmic function of the detector current and said gain FET operates in saturation where said signal current is a function of the square of its gate-to-source voltage so that the transconductance ratio and, hence the gain of the current mirror vary logarithmically with changes in detector current.

4. The readout circuit of claim 3, wherein said FFTs are N-channel devices having respective drains and sources, said load FET's source being connected to said photodetector and its drain being connected to a first bias voltage that reverse biases the photodetector, said gain FET's drain current being connected to an output terminal at which said signal current is provided and its source being connected to a second bias voltage that sets its nominal gate-to-source voltage so that the gain FET's transconductance is larger than the load FET's transconductance.

5. The readout circuit of claim 1, wherein the gain FET has a transconductance $g_{gain}$ and its gate is connected to the load FET's source, further comprising:
   a load resistor that is connected in series with the load FET's source; and
   a gain resistor that is connected in series with the gain FET's source, said load and gain resistors' resistances $R_L$ and $R_G$, respectively, dominating the load and gain FETs' transimpedances $(1/g_{load})$ and $(1/g_{gain})$ so that the current mirror's gain is set by the ratio of said load to said gain FET resistances and is substantially independent of the small-signal detector current.

6. The readout circuit of claim 5, wherein at least one of said load and gain resistors is a variable resistor.

7. The readout circuit of claim 6, wherein said variable resistor comprises a switched capacitor.

8. The readout circuit of claim 1, wherein as the number of incident photons is reduced towards zero, the amplifier's negative feedback loop slows down to the RC time constant set by the current mirror to maintain stabilization, and as the number of photons increases, the amplifier recovers and speeds up the feedback loop to increase the circuit's bandwidth.

9. The readout circuit of claim 1, wherein said photodetector converts each incident photon into a single electron so that all of said gain is provided by said current mirror.

10. A single-photon readout circuit, comprising:
    a reverse biased photodetector that conducts a single electron in response to each incident photon to generate a small-signal detector current, said photodetector having a characteristic capacitance;

a load field effect transistor (FET) having 1/f noise that self-adjusts its gate-to-source voltage to conduct the photodetector's small-signal detector current, said FET operating in its subthreshold region where its gate-to-source voltage is a logarithmic function of the detector current and defines a transconductance $g_{load}$, said photodetector's capacitance and said load FET's transconductance together defining an RC time constant that limits the circuit's bandwidth;

an amplifier that is connected in a negative feedback loop around said load FET's gate-to-source voltage, said amplifier's negative feedback loop slowing down towards the bandwidth set by the RC time constant to maintain a stable gate voltage when the number of incident photons approaches zero, and, as the number of photons increases, speeding up to divide the RC time constant by the amplifier's gain and expand the circuit's bandwidth, said amplifier also pinning the load FET's gate voltage for a given detector current so that the load FET's 1/f noise is transferred to the amplifier;

a gain FET having a gate that is modulated by the load FET's gate voltage, a drain, and a source that is biased to define a transconductance $g_{gain}$ and operate the gain FET in saturation where its drain current is a function of the square of its modulated gate-to-source voltage, said drain current providing an amplified facsimile of said small-signal detector current with the gain being set by the ratio $g_{gain}/g_{load}$ which varies logarithmically with detector current; and a sampling circuit that samples the drain current at a sampling frequency $f_s$ that exceeds the bandwidth defined by the RC time constant but is less than the circuit's expanded bandwidth so that the sampled signal current accurately tracks the small-signal detector current.

11. The readout circuit of claim 10, wherein said sampling circuit comprises:

a capacitor that integrates the signal current to define a signal voltage;

an access switch that is clocked at said sampling frequency $f_s$ to read said signal voltage; and a reset switch that is clocked to discharge said capacitor after said signal voltage is read.

12. The readout circuit of claim 10, wherein said FETs are N-channel devices having respective drains and sources and which share a common gate, said load FET's drain being connected to said photodetector and its source being connected to a first bias voltage that reverse biases the photodetector.

13. A single-photon readout circuit, comprising:

a reverse biased photodetector that conducts a single electron in response to each incident photon to generate a small-signal detector current, said photodetector having a characteristic capacitance;

a load field effect transistor (FET) having 1/f noise that self-adjusts its gate-to-source voltage to conduct the photodetector's small-signal detector current, said FET operating in its subthreshold region where its gate-to-source voltage is a logarithmic function of the detector current and defines a transconductance $g_{load}$, said photodetector's capacitance and said load FET's transconductance together defining an RC time constant that limits the circuit's bandwidth;

a load resistor that is connected to the load FET's source and conducts the detector current, said load resistor's resistance $R_L$ dominating the load FET's transimpedance $(1/g_{load})$ to linearize its response;

an amplifier that is connected in a negative feedback loop around said load FET's gate-to-source voltage, said amplifier's negative feedback loop slowing down towards the bandwidth set by the RC time constant to maintain a stable gate voltage when the number of incident photons approaches zero, and, as the number of photons increases, speeding up to divide the RC time constant by the amplifier's gain and expand the circuit's bandwidth, said amplifier also pinning the load FET's gate voltage so that the load FET's 1/f noise is transferred to the amplifier and the detector current modulates the FET's source voltage;

a gain FET having a gate that is modulated by the load FET's source voltage at one end of the load resistor, a drain, and a source that is biased to define a transconductance $g_{gain}$ and operate the gain FET in saturation where its drain current is a function of the square of its modulated gate-to-source voltage, said drain current providing an amplified facsimile of said small-signal detector current;

a gain resistor that is connected to the gain FET's source and conducts the signal current, said gain resistor's resistance $R_L$ dominating the gain FET's transimpedance $(1/g_{gain})$ to linearize its response so that the gain of the circuit is set by the ratio $R_L/R_G$ which is independent of detector current; and a sampling circuit that samples the drain current at a sampling frequency $f_s$ that exceeds the bandwidth defined by the RC time constant but is less than the circuit's expanded bandwidth so that the sampled signal current accurately tracks the small-signal detector current.

14. The readout circuit of claim 13, wherein at least one of said load and gain resistors is a variable resistor.

15. The readout circuit of claim 14, wherein said variable resistor comprises a switched capacitor.

16. The readout circuit of claim 13, wherein said sampling circuit comprises:

a capacitor that integrates the signal current to define a signal voltage;

an access switch that is clocked at said sampling frequency $f_s$ to read said signal voltage; and a reset switch that is clocked to discharge said capacitor after said signal voltage is read.

* * * * *